United States Patent
Svorc et al.

(10) Patent No.: US 11,482,995 B1
(45) Date of Patent: Oct. 25, 2022

(54) PULSE WIDTH MODULATION CIRCUIT WITH REDUCED MINIMUM ON-TIME

(71) Applicant: Dialog Semiconductor (UK) Limited, London (GB)

(72) Inventors: Jindrich Svorc, Prague (CZ); Jens Masuch, Munich (DE)

(73) Assignee: Dialog Semiconductor (UK) Limited, London (GB)

( * ) Notice: Subject to any disclaimer, the term of this patent is extended or adjusted under 35 U.S.C. 154(b) by 66 days.

(21) Appl. No.: 16/935,408

(22) Filed: Jul. 22, 2020

(51) Int. Cl.
  *H03K 7/08* (2006.01)
  *H02M 3/156* (2006.01)
  *H02M 1/00* (2006.01)

(52) U.S. Cl.
  CPC .............. *H03K 7/08* (2013.01); *H02M 3/156* (2013.01); *H02M 1/0009* (2021.05)

(58) Field of Classification Search
  CPC ....... H03K 7/08; H02M 3/156; H02M 1/0009
  See application file for complete search history.

(56) References Cited

U.S. PATENT DOCUMENTS

| 10,122,272 B1* | 11/2018 | Nogawa | H02M 3/157 |
| 2015/0069979 A1* | 3/2015 | Lin | H02M 1/4225 323/205 |

* cited by examiner

*Primary Examiner* — Jeffrey M Shin
(74) *Attorney, Agent, or Firm* — Saile Ackerman LLC; Stephen B. Ackerman

(57) ABSTRACT

A pulse width modulator PWM circuit and a corresponding method are presented. The PWM circuit receives a control signal and a clock signal. The PWM circuit generates an output signal based on the control signal and the clock signal. The output signal has a first or second signal value. The PWM circuit has a delay circuit to generate, by delaying the clock signal by a delay period, a first enable signal for setting the output signal to the first signal value. The PWM circuit has a ramp generator to generate a ramp signal based on the clock signal. The PWM circuit has a comparator to generate, by comparing the control signal with the ramp signal, a second enable signal for setting the output signal to the second signal value. By delaying the clock signal by the delay period, a minimum on-time of the output signal may be reduced.

10 Claims, 6 Drawing Sheets

PULSE WIDTH MODULATION CIRCUIT WITH REDUCED MINIMUM ON-TIME

TECHNICAL FIELD

The present document relates to pulse width modulation (PWM) circuits and corresponding modulation methods. In particular, the present document relates to PWM circuits and methods for controlling duty-cycles in switched-mode power supplies (SMPSs).

BACKGROUND

Pulse width modulation is frequently used to control the switching behaviour of one or more pass devices of a switched-mode power supply. By comparing a control signal with a saw-tooth-shaped signal, the signal value of the control signal is translated into a corresponding time interval during which one of the SMPS's pass devices is closed (i.e. turned on). The time interval during which the pass device is closed is denoted as on-time of the pass device, and the time interval during which the pass device is open is denoted as off-time of the pass device. The ratio between the on-time and the off-time may be denoted as duty-cycle of the pass device. The control signal itself is usually generated with the help of a feedback loop, and depends (directly or indirectly) on a voltage or current at the output of the SMPS.

One drawback of conventional PWM circuits is caused by the delay of the comparator used to perform the comparison between the control signal and the saw-tooth-shaped signal. As a consequence, the detection of the moment when the control signal crosses the ramp of the saw-tooth-shaped signal may be substantially delayed, and the pass device may be turned off too late. In other words, the delay of the comparator may cause an increased minimum on-time of the pass device, an increased minimum duty-cycle, and ultimately an increased minimum output voltage of the SMPS.

SUMMARY

The present document addresses the above mentioned technical problems. In particular, the present document addresses the technical problem of providing a PWM circuit for enabling a reduced minimum on-time of the pass device. According to an aspect, a pulse width modulator PWM circuit is presented. The PWM circuit may be configured to receive a control signal and a clock signal. The PWM circuit may be configured to generate an output signal based on said control signal and said clock signal, wherein the output signal has a first signal value or a second signal value. The PWM circuit may comprise a delay circuit configured to generate, by delaying the clock signal by a delay period, a first enable signal for setting the output signal to the first signal value. The PWM circuit may comprise a ramp generator configured to generate a ramp signal based on the clock signal. The PWM circuit may comprise a comparator configured to generate, by comparing the control signal with the ramp signal, a second enable signal for setting the output signal to the second signal value.

For example, all signals (i.e. the control signal, the clock signal, the ramp signal, the first and the second enable signal, and the output signal) may be represented by corresponding voltages and/or currents.

The clock signal may be e.g. a pulse wave (also denoted as rectangular wave), i.e. a periodic binary signal whose amplitude alternates between a high value and a low value. Also, the first enable signal and the second enable signal may be binary signals, i.e. signals alternating between high values and low values. For example, the first enable signal may have a high value for setting the output signal to the first signal value, or the first enable signal may have a low value for setting the output signal to the first signal value. Similarly, the second enable signal may have a high value for setting the output signal to the second signal value, or the second enable signal may have a low value for setting the output signal to the second signal value.

The ramp signal may have arbitrary, continuous signal values between a minimum signal value and a maximum signal value. After being triggered by the clock signal, the ramp signal may (linearly) increase or (linearly) decrease. The control signal may have an arbitrary value. In particular, the value of the control signal may be (a) smaller than the minimum signal value of the ramp signal, (b) between the minimum signal value and the maximum signal value of the ramp signal, or (c) larger than the maximum signal value of the ramp signal.

In the following description, a time interval during which the output signal has the first signal value is denoted as on-time. Analogously, a time interval during which the output signal has the second signal value is denoted as off-time. The ratio between the duration of the on-time and the duration of the off-time is called the duty-cycle of the output signal. In general, the PWM circuit is configured to translate a signal value of the control signal into a corresponding duty-cycle of the output signal. Or, in other words, the PWM circuit may be configured to modulate a pulse width of the output signal in accordance with the signal value of the control signal. The delay circuit may be implemented e.g. with the help of one or more inverter circuits. The comparator may or may not have hysteresis.

By delaying the clock signal by the delay period, the first enable signal may be delayed with regard to the ramp signal (which is also based on the clock signal). As a consequence, the first enable signal may also be delayed with regard to the second enable signal (which is based on the ramp signal), resulting in a reduction of a minimum on-time of the output signal. This is in particular advantageous in application scenarios where small duty-cycles of the output signal are required.

The PWM circuit may further comprise a first flip-flop configured to generate the output signal based on the first enable signal and the second enable signal. The first flip-flip (or latch) may be a circuit that has two stable states and may be used to store corresponding state information. The first flip-flop may be edge-triggered or level-triggered. For example, the first enable signal may be applied to a set input of the first flip-flop, and the second enable signal may be applied to a reset input of the first flip-flop.

The delay period may be equal to or larger than a delay of the comparator. The delay of the comparator may be defined as the time required by the comparator for generating the second enable signal based on the control signal and the ramp signal. Specifically, the delay of the comparator may be seen as the time between the moment when the ramp signal crosses the control signal and the moment when the second enable signal at the output of the comparator changes its value. And more specifically, the delay of the comparator may be seen as the time between the moment when the ramp signal crosses the control signal and the moment when the second enable signal at the output of the comparator has settled to its final value. As an advantage, the PWM circuit is capable of compensating the delay of the comparator, and is thus capable of generating an output signal with an arbitrarily low duty-cycle (such as e.g. a duty-cycle of 0%).

The ramp generator may comprise a release input. The clock signal may be applied to said release input, and the ramp generator may be configured to generate the ramp signal such that the ramp signal has an initial signal value until a signal change of the clock signal occurs at the release input, and such that the ramp signal starts increasing or decreasing with a constant slope responsive to the signal change of the clock signal. The signal change of the clock signal may be a raising edge of the clock signal (i.e. a transition from the low value of the clock signal to the high value of the clock signal) or a falling edge of the clock signal (i.e. a transition from the high value of the clock signal to the low value of the clock signal). The initial signal value of the ramp signal may be the minimum signal value of the ramp signal, and, upon detection of the signal change of the clock signal at the release input, the ramp signal may be increasing with a constant, positive slope. Alternatively, the initial signal value of the ramp signal may be the maximum signal value of the ramp signal, and, upon detection of the signal change of the clock signal at the release input, the ramp signal may be decreasing with a constant, negative slope.

The PWM circuit may comprise a second flip-flop wherein the second enable signal is coupled to a first input of the second flip-flop, the clock signal is coupled to a second input of the second flip-flop, and an output of the second flip-flop is coupled to a reset input of the ramp generator. For example, the first input of the second flip-flop may be a set input of the second flip-flop, and the second input of the second flip-flop may be a reset input of the second flip-flop.

The ramp generator may be configured to generate the ramp signal such that the ramp signal returns to said initial signal value when a signal change occurs at said reset input of the ramp generator. Alternatively, the ramp generator may be configured to generate the ramp signal such that the ramp signal returns to said initial signal value when the ramp signal reaches a threshold value. If the ramp generator is configured to generate the ramp with a positive slope, the threshold value may be the maximum value of the ramp signal. The other way around, if the ramp generator is configured to generate the ramp with a negative slope, the threshold value may be the minimum value of the ramp signal.

The PWM circuit may be configured to adjust the delay period based on a current value of the control signal, and/or a current value of the output signal. For instance, the PWM circuit may be configured to set the delay period to 0 when the control signal reaches a pre-determined threshold value. For example, in case the ramp signal has a positive slope, the PWM circuit may be configured to set the delay period to 0 when the control signal exceeds the pre-determined threshold value. In case the ramp signal has a negative slope, the PWM circuit may be configured to set the delay period to 0 when the control signal falls below the pre-determined threshold value.

According to another aspect, a power converter is presented. The power converter may comprise a pass device and elements of the above-described PWM circuit, and the output signal of the PWM circuit may be applied to a control input of the pass device for controlling a current flow through said pass device. The power converter may be e.g. a switched-mode power supply SMPS. The pass device may be implemented with any suitable device, such as, for example, a metal-oxide-semiconductor field effect transistor MOSFET, an insulated-gate bipolar transistor IGBT, a MOS-gated thyristor, or any other suitable power device. The pass device may be operated as a switching element which may be open or closed. In particular, the control input of the pass device may be e.g. a gate to which the output signal of the PWM circuit may be applied to turn the pass device on (i.e. to close the pass device) or to turn the pass device off (i.e. to open the pass device).

The power converter may be a buck power converter, and the pass device may be used as a high-side switching element or low-side switching element of this buck power converter. The high-side switching element may be coupled between an input of the buck power converter and a switching node. The low-side switching element may be coupled between the switching node and a reference potential. An inductor may be coupled between the switching node and an output of the buck power converter.

The power converter may be a boost power converter, and the pass device may be used as a high-side switching element or low-side switching element of this boost power converter. The high-side switching element may be coupled between an output of the boost power converter and a switching node. The low-side switching element may be coupled between the switching node and a reference potential. An inductor may be coupled between an input of the boost power converter and the switching node.

Of course, the power converter may also be a buck-boost power converter, and the pass device (driven by the described PWM circuit) may be used as any of the switching elements of the buck-boost power converter.

According to yet another aspect, a method of operating a PWM circuit is described. The method may comprise steps which correspond to the features of the PWM circuit described in the present document. Specifically, the PWM circuit may be used to generate an output signal based on a control signal and a clock signal, wherein the output signal has a first signal value or a second signal value. The PWM circuit may comprise a delay circuit, a ramp generator, and a comparator. The method may comprise generating, by the delay circuit, by delaying the clock signal by a delay period, a first enable signal for setting the output signal to the first signal value. The method may comprise generating, by the ramp generator, a ramp signal based on the clock signal. The method may comprise generating, by the comparator, by comparing the control signal with the ramp signal, a second enable signal for setting the output signal to the second signal value.

The method may comprise generating, by a first flip-flop, the output signal based on the first enable signal and the second enable signal. The delay period may be equal to or larger than a delay of the comparator.

The ramp generator may comprise a release input, wherein the clock signal is applied to said release input. The method may comprise generating, by the ramp generator, the ramp signal such that the ramp signal has an initial signal value until a signal change of the clock signal occurs at the release input, and such that the ramp signal starts increasing or decreasing with a constant slope responsive to the signal change of the clock signal.

The PWM circuit may further comprise a second flip-flop, and the method may comprise coupling the second enable signal to a first input of the second flip-flop, coupling the clock signal to a second input of the second flip-flop, and coupling an output of the second flip-flop to a reset input of the ramp generator. The method may comprise generating, by the ramp generator, the ramp signal such that the ramp signal returns to said initial signal value when a signal change occurs at said reset input.

The method may comprise adjusting the delay period based on a current value of the control signal and/or a current value of the output signal. For instance, the method may comprise setting the delay period to 0 when the control signal reaches a pre-determined threshold value.

The method may comprise applying the output signal of the PWM circuit to a control input of a pass device of a power converter for controlling a current flow through said pass device.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The present invention is illustrated by way of example, and not by way of limitation, in the figures of the accompanying drawings in which like reference numerals refer to similar or identical elements, and in which.

DESCRIPTION

Figure 1:
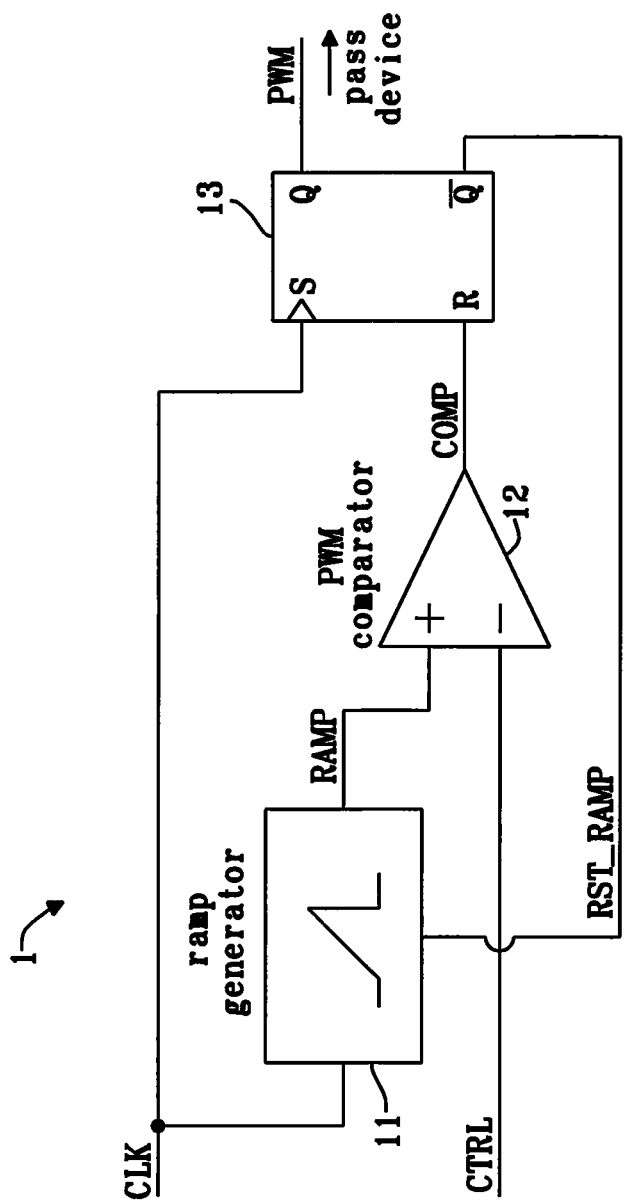
FIG. 1 shows a common PWM circuit.

Pulse width modulation (PWM) based switched-mode power supplies (SMPSs) are widely used. They naturally show a shorter required minimum on-time $t_{on}$ in comparison to for example peak current mode controllers. But there is still, of course, a limitation. FIG. 1 shows a common PWM circuit 1. It usually comprises a saw-tooth waveform generator (ramp generator) 11 and a fast comparator 12 which compares a clock signal CLK with the ramp signal RAMP. In addition, the PWM circuit 1 comprises a flip-flop 13. The common PWM circuit 1 has two inputs and one output: One digital clock signal input CLK and second analog control signal CTRL which sets the duty-cycle of the PWM digital output.

Figure 2A:
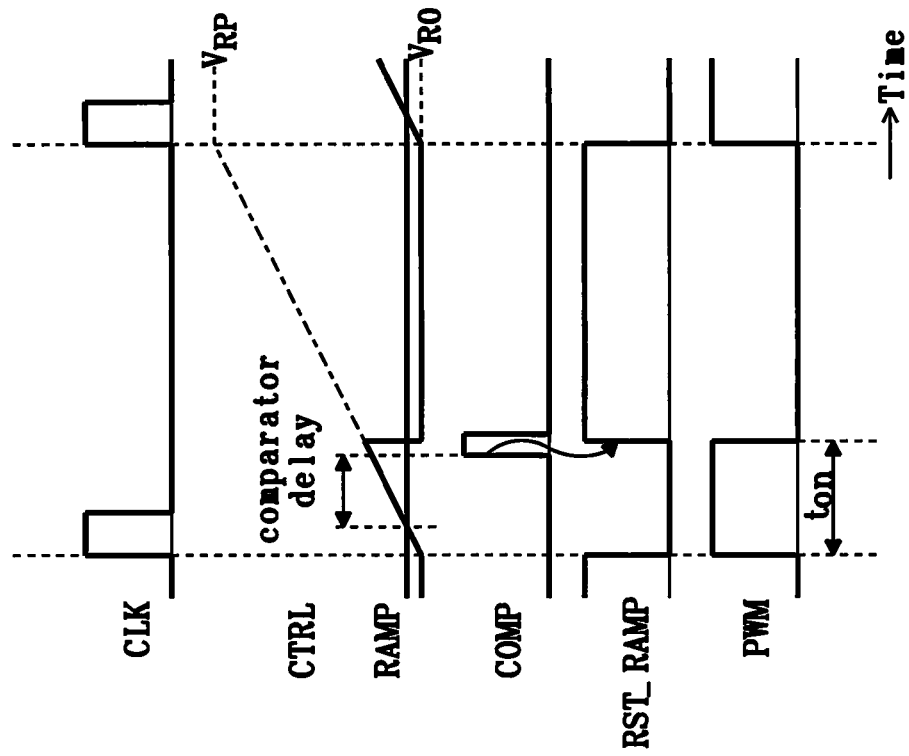
FIG. 2A and FIG. 2B show typical and minimum duty-cycles respectively in a common PWM circuit.
Figure 2B:
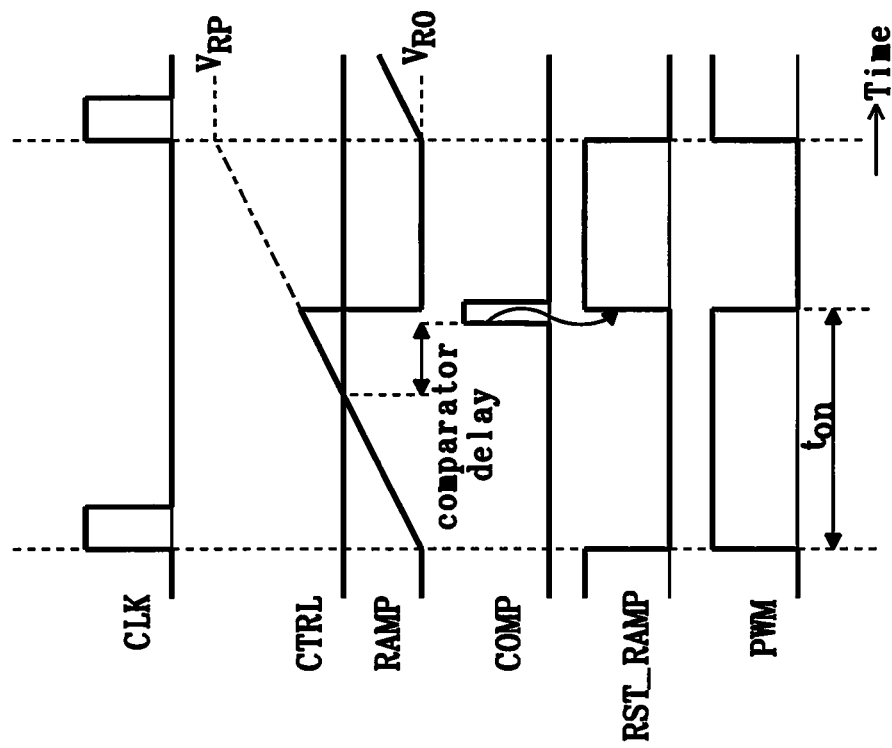

Usually, a positive edge of the clock signal CLK releases the ramp signal and simultaneously turns on the high-side pass device (not shown) via the flip-flop 13. Under the assumption that the pass device's positive and negative edge driver delays are almost identical, the only delay which contributes to the minimum on-time $t_{on}$ is the delay of the comparator 12 and following logic. FIG. 2A shows a typical duty-cycle, and FIG. 2B shows a minimum duty-cycle in the common PWM circuit 1. In particular, the diagrams in FIG. 2A show the behavior of the common PWM circuit 1 for a duty-cycle value somewhere in the middle of the full range. The diagrams in FIG. 2B show the behavior of the same modulator for a case with minimum achievable $t_{on}$ time. The $t_{on}$ time is directly linked to a minimum achievable duty-cycle and thus the output voltage of the power converter (not shown). It is apparent from the diagrams on the right-hand side that the main contributor to the minimum $t_{on}$ time is the delay of the comparator 12 and following logic.

Figure 3:
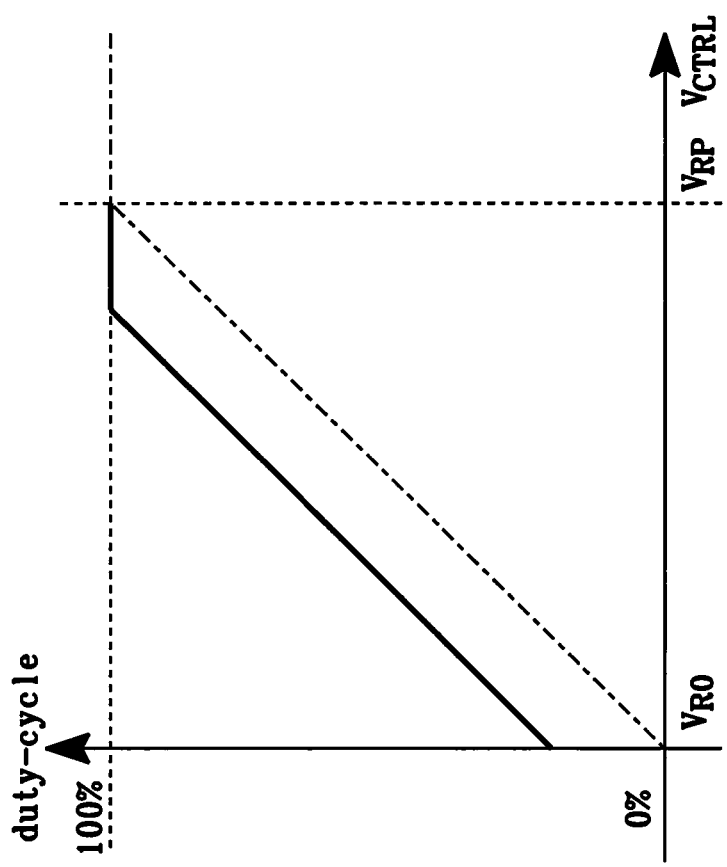
FIG. 3 shows a transfer function of a common PWM circuit.

FIG. 3 shows an exemplary transfer function of the common PWM circuit 1 using a solid line. The dotted line represents the ideal case which does not suffer from $t_{on}$ time limitation. The transfer function of the non-ideal PWM circuit 1 shows significant discontinuity for a minimum control signal level $V_{R0}$ where the duty-cycle steps from 0% to a certain level above zero (about 20% in FIG. 3). Such a transfer function means that a low duty-cycle (e.g. smaller than 20%) can only be achieved with pulse-skipping.

The present invention now suggests delaying the clock of the logic which generates the control signal for the pass device with respect to the signal which releases the ramp. With a reasonable delay, the comparator may trip even before the high side pass device is actually on, and minimize the minimum achievable $t_{on}$ time. The correct value of the input control signal may be assured by the control loop.

Figure 4:
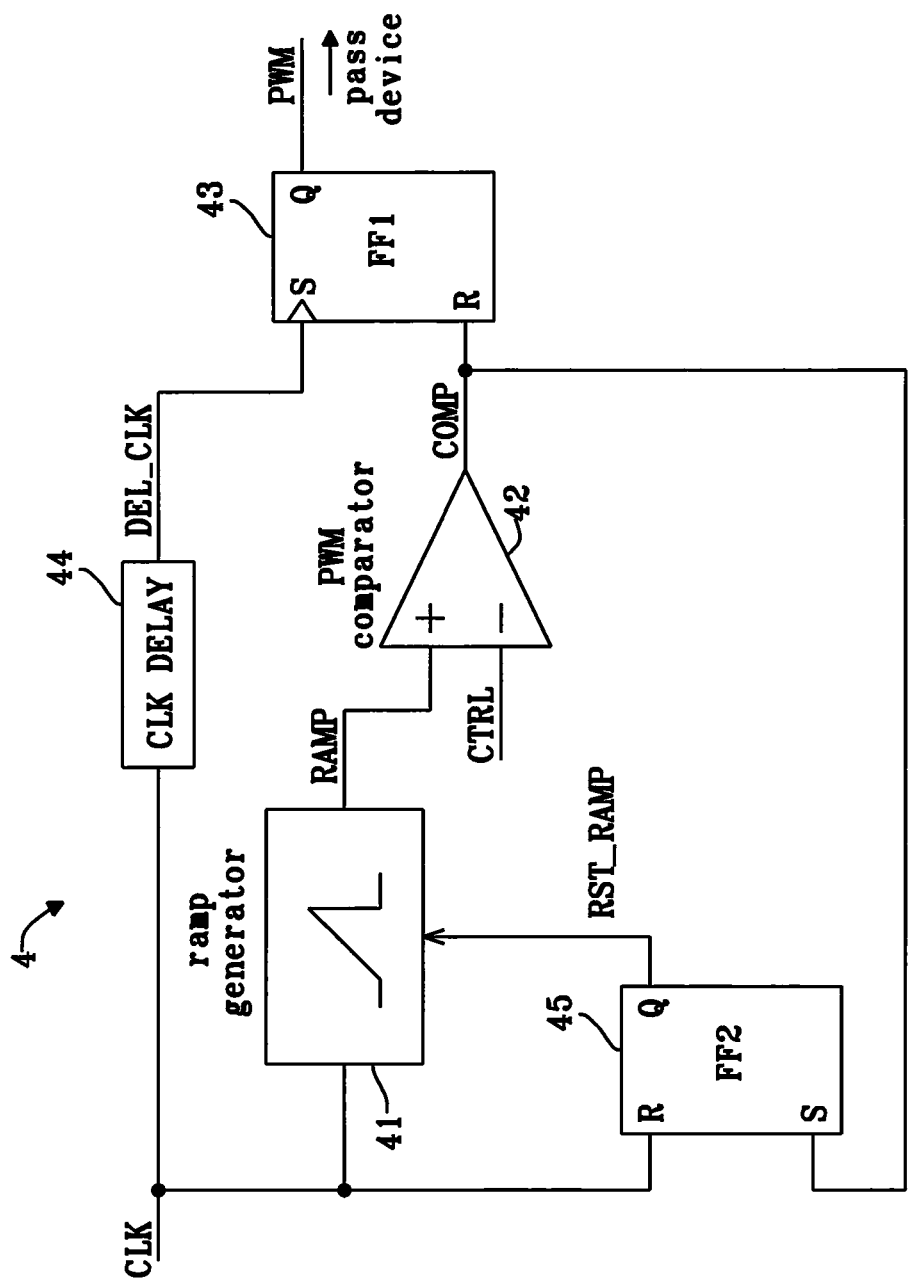
FIG. 4 shows an exemplary PWM circuit.

FIG. 4 shows an exemplary PWM circuit according to the teachings of the present invention. It comprises a ramp generator 41, a comparator 42, a delay circuit 44, a first flip-flop 43, and a second flip-flop 45. The main idea is to delay the start of the PWM pulse with respect to the release of the ramp. The delay circuit 44 introduces an additional delay at the 'S' (set) input of the first flip-flop FF1 1. The 'R' (reset) input may be level sensitive. The 'S' input of the flip-flop FF1 1 may be either edge or level sensitive. If the 'S' input is level sensitive, the 'R' input may be dominant, otherwise the pulse width of the clock signal could dictate the minimum $t_{on}$ time. Additional flip-flop FF2 2 generates the RST_RAMP signal. The ramp generator reset is released with the edge of the clock signal and is asserted just after the comparator trips. The set input 'S' of flip-flop FF2 may be level sensitive, whereas 'R' input may be either edge or level sensitive. In case of level sensitive 'R' input, the 'S' input could be dominant.

If the CTRL signal is below the starting point of the RAMP signal, the comparator output COMP is 0, so the PWM output is 0 as well. The 'R' input of flip-flop FF1 is dominant, so no matter what is happening at DEL_CLK, the PWM stays 0, resulting in a 0% duty-cycle. If the CTRL signal is above the highest possible level of the RAMP signal, the comparator 42 never trips, so the flip-flop FF1 stays high and the output PWM is 1, resulting in a 100% duty-cycle.

Figure 5:
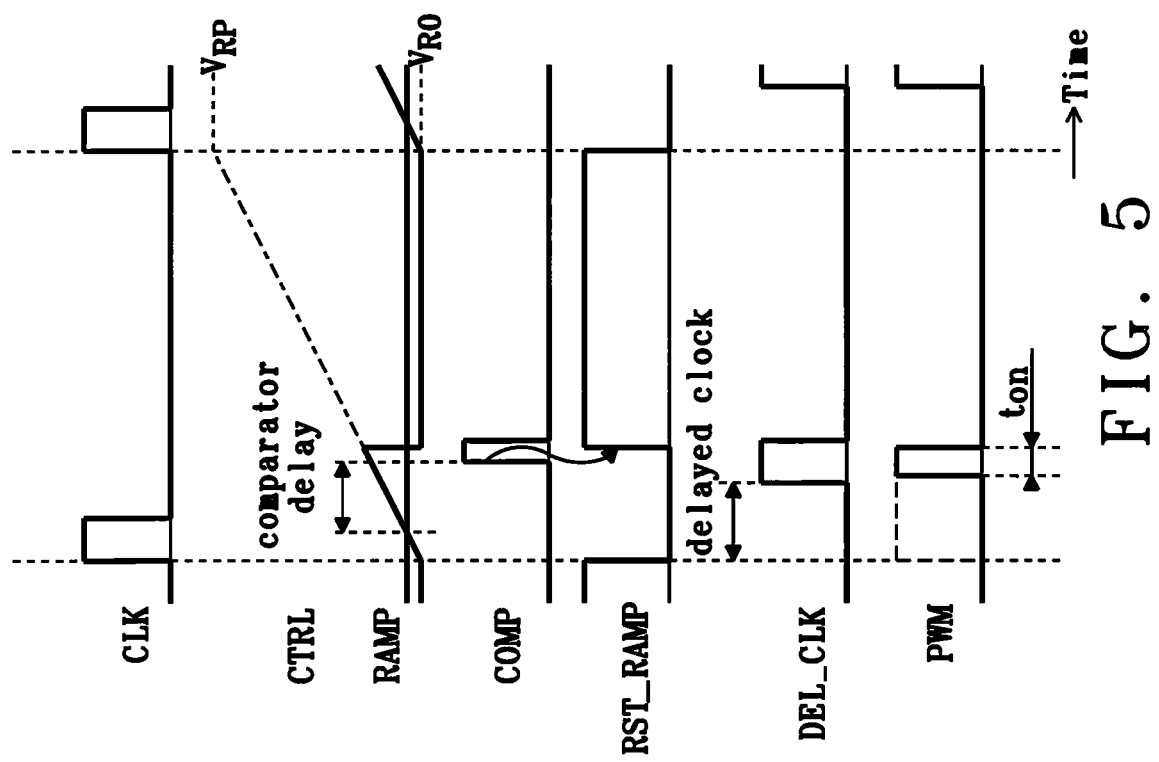
FIG. 5 shows timing diagrams for the PWM circuit of FIG. 4.

FIG. 5 shows timing diagrams for the PWM circuit of FIG. 4. The CLK DELAY block 44 (delay circuit) delays the clock signal for the start of the PWM pulse, whereas the ramp generator reset RST_RAMP is released with the positive edge of the main clock signal CLK. The CLK DELAY block 44 generates, by delaying the clock signal by a certain delay period, a first enable signal DEL_CLK for setting the output signal PWM. For example, the delay period may be chosen to compensate the delay of the comparator 42. The comparator 42 generates, by comparing the control signal CTRL with the ramp signal RAMP, a second enable signal COMP for resetting the output signal PWM. At the same time, the second enable signal COMP is used to reset the ramp generator 41 via the second flip-clop 45, which generates the reset signal RST_RAMP which is applied to a reset input of the ramp generator 41.

FIG. 5 shows a similar case as shown on the right-hand side of FIG. 2. Although there is the same comparator delay in both cases, the improved scheme can achieve a much shorter $t_{on}$ time thanks to the delayed clock signal. The duty-cycle has theoretically a completely smooth transition between 0% and higher levels of duty-cycles.

Figure 6:
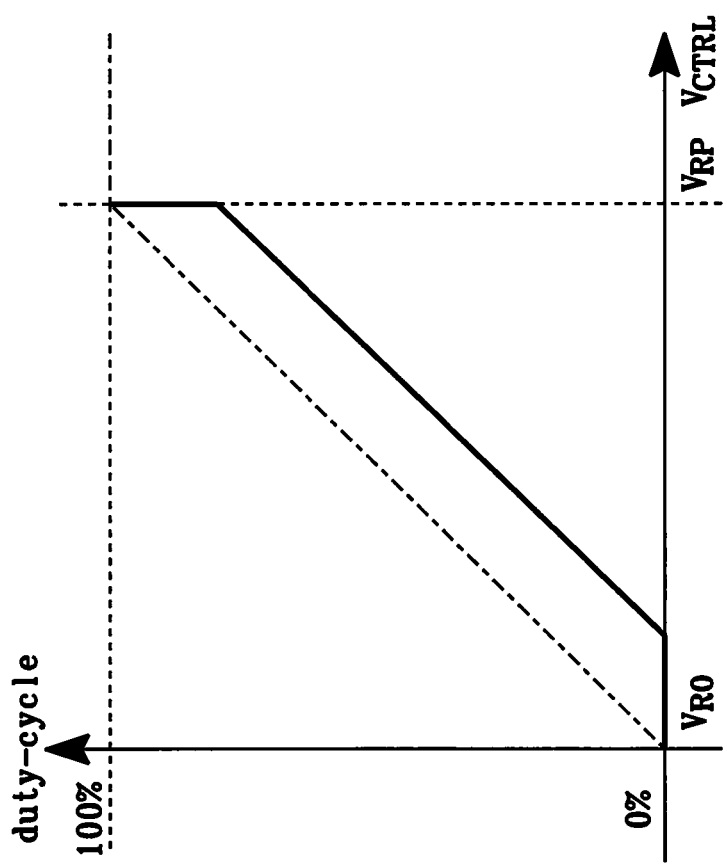
FIG. 6 shows a transfer function of the PWM circuit of FIG. 4.

FIG. 6 shows a transfer function (i.e. the relation between the duty-cycle and the input control signal $V_{CTRL}$) of the PWM circuit of FIG. 4. The solid line is the proposed solution and the black dotted line is the ideal case. As it was mentioned before, there may be a smooth transition at 0% duty-cycle. On the other hand, it is apparent that there is a discontinuity at higher duty-cycles. This means that the proposed solution is of particular interest in application scenarios where a low duty-cycle is expected.

In case the SMPS operates over the whole range of duty-cycles, the proposed solution can be used as well. In such a case, the delay will be adjusted between two or more values or completely disabled based on the expected nominal duty-cycle. The decision can be made based on for example (1) voltage reference DAC digital input (digital comparison), (2) voltage reference DAC analog output level value (analog comparison with hysteresis), (3) $t_{on}$ time comparison with reference delay and significant hysteresis so the delay is not being turned on and off periodically, or (4) input voltage level (analog comparison with hysteresis—presumably for systems with fixed $V_{out}$).

The proposed invention has an additional advantage compared to the prior art: It pushes the point where the ramp signal intersects with the control signal towards higher levels. This means that a more linear region of the ramp signal is used. The reason behind this is that the ramp signal usually starts from a given starting point, for example 0, and it takes a short period of time before the ramp signal settles down. If we delay the clock for the pass-device control logic, the overall loop acts in a way that the signal which feeds the PWM circuit is elevated and crosses the ramp signal after the time when it has settled.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A pulse width modulator PWM circuit configured to receive a control signal and a clock signal, and to generate an output signal based on said control signal and said clock signal, wherein the output signal has a first signal value or a second signal value, wherein the PWM circuit comprises
    a delay circuit configured to generate, by delaying the clock signal by a delay period, a first enable signal for setting the output signal to the first signal value;
    a ramp generator configured to generate a ramp signal based on the clock signal; and
    a comparator configured to generate, by comparing the control signal with the ramp signal, a second enable signal for setting the output signal to the second signal value,
wherein the ramp generator comprises a release input, wherein the clock signal is applied to said release input, and wherein the ramp generator is configured to generate the ramp signal such that the ramp signal
    has an initial signal value until a signal change of the clock signal occurs at the release input, and such that the ramp signal
    starts increasing or decreasing with a constant slope responsive to the signal change of the clock signal; and
wherein the PWM circuit further comprises a second flip-flop, wherein
    the second enable signal is coupled to a first input of the second flip-flop,
    the clock signal is coupled to a second input of the second flip-flop, and
    an output of the second flip-flop is coupled to a reset input of the ramp generator.

2. The PWM circuit of claim 1, further comprising a first flip-flop configured to generate the output signal based on the first enable signal and the second enable signal.

3. The PWM circuit of claim 1, wherein the delay period is equal to or larger than a delay of the comparator.

4. The PWM circuit of claim 1, wherein the ramp generator is configured to generate the ramp signal such that the ramp signal returns to said initial signal value when a signal change occurs at the reset input of the ramp generator.

5. A power converter comprising a pass device and the PWM circuit of claim 1, wherein the output signal of the PWM circuit is applied to a control input of the pass device for controlling a current flow through said pass device.

6. A method of operating a pulse width modulator PWM circuit for generating an output signal based on a control signal and a clock signal, wherein the output signal has a first signal value or a second signal value, wherein the PWM circuit comprises a delay circuit, a ramp generator, and a comparator, wherein the method comprises
    generating, by the delay circuit, by delaying the clock signal by a delay period, a first enable signal for setting the output signal to the first signal value;
    generating, by the ramp generator, a ramp signal based on the clock signal; and
    generating, by the comparator, by comparing the control signal with the ramp signal, a second enable signal for setting the output signal to the second signal value,
wherein the ramp generator comprises a release input, wherein the clock signal is applied to said release input, and wherein the method comprises generating, by the ramp generator, the ramp signal such that the ramp signal
    has an initial signal value until a signal change of the clock signal occurs at the release input, and
    starts increasing or decreasing with a constant slope responsive to the signal change of the clock signal; and
wherein the PWM circuit further comprises a second flip-flop, wherein the method comprises
    coupling the second enable signal to a first input of the second flip-flop,
    coupling the clock signal to a second input of the second flip-flop, and
    coupling an output of the second flip-flop to a reset input of the ramp generator.

7. The method of claim 6, further comprising
    generating, by a first flip-flop, the output signal based on the first enable signal and the second enable signal.

8. The method of claim 6, wherein the delay period is equal to or larger than a delay of the comparator.

9. The method of claim 6, wherein the method comprises
    generating, by the ramp generator, the ramp signal such that the ramp signal returns to said initial signal value when a signal change occurs at said reset input.

10. The method of claim 6, wherein the method comprises applying the output signal of the PWM circuit to a control input of a pass device of a power converter for controlling a current flow through said pass device.

* * * * *